United States Patent [19]

Van Sickle

[11] 3,736,445

[45] May 29, 1973

[54] PROXIMITY DETECTOR

[75] Inventor: Truman Ted Van Sickle, Saline, Mich.

[73] Assignee: Medar, Inc., Ann Arbor, Mich.

[22] Filed: Jan. 12, 1970

[21] Appl. No.: 2,021

[52] U.S. Cl. .......................307/308, 307/254, 328/5, 340/258, 315/84.5

[51] Int. Cl. .............................................H03k 17/00

[58] Field of Search .......................328/5; 340/258 C; 317/DIG. 2; 307/251, 308

[56] References Cited

UNITED STATES PATENTS

| | | | |
|---|---|---|---|
| 2,369,659 | 2/1945 | Carr | 328/5 X |
| 2,554,800 | 5/1951 | Steiner | 340/258 C |
| 3,194,975 | 7/1965 | Deamond | 328/5 X |
| 3,255,380 | 6/1966 | Atkins et al. | 328/5 X |
| 3,459,961 | 8/1969 | Ravas | 328/5 |
| 3,473,054 | 10/1969 | Wieczorek | 307/251 X |
| 3,500,368 | 3/1970 | Abe | 307/251 X |

*Primary Examiner*—Herman Karl Saalbach
*Assistant Examiner*—B. P. Davis
*Attorney*—Harness, Dickey & Pierce

[57] ABSTRACT

A proximity detector having a plate for receiving electromagnetic radiation coupled from a source thereof by a human member or the like and a field effect transistor for detecting coupled energy above a threshold level and providing an amplified output signal in response thereto. The proximity detector may be used as an on-off switch by incorporating a bistable circuit operated by the amplified output signal, and an electronic switch responsive to the two stable states of the bistable circuit.

A dimmer control having a proximity detector as described above in combination with an operational amplifier for yielding an output signal representative of the time that electromagnetic energy above a threshold level is coupled to the receiving plate, and a control circuit for adjusting its output power level in accordance with the level of the output signal from the operational amplifier.

A circuit for selecting one of a plurality of parameters and automatically cancelling all previous selections having a proximity detector as described above for each parameter in combination with a glow discharge tube receiving the output of the respective proximity detectors. The glow discharge tubes are coupled at their output by capacitors so that the energization of one automatically deenergizes the other glow discharge tubes.

2 Claims, 7 Drawing Figures

INVENTOR.
Truman Ted Van Sickle
BY
Harness, Dickey & Pierce
ATTORNEYS.

INVENTOR.
Truman Ted Van Sickle
BY
Harness, Dickey & Pierce
ATTORNEYS.

PROXIMITY DETECTOR

BACKGROUND OF THE INVENTION

The present invention relates to proximity detectors, capacitive switches, dimming devices, power level controls, and selection circuits.

SUMMARY OF THE INVENTION

The present invention provides a proximity detector having a field effect transistor receiving energy coupled from a source of electromagnetic radiation by proximity of a human member or other suitable element. The term "proximity" as used herein connotes actual contact as well as adjacent placement which provides substantial electromagnetic coupling. The field effect transistor is characterized by high input impedance to provide efficient power transfer from the coupling circuit, and furthermore, operates only when a predetermined level of coupling is achieved to avoid extraneous activation of the proximity detector. The present invention also provides a novel proximity switch having a multistable circuit operated by the output of the above described proximity detector and an electronic switch responsive to the stable states of the multi-stable element. The switch according to this invention is fast acting and has no moving parts or contacts. Accordingly, the switch is silent and is free of mechanical wear.

The present invention still further provides a novel power level control which may be used as a dimmer switch for a lighting system, an automatic tuning device or volume control for a radio, a heat control for a stove, etc. In a preferred embodiment for controlling the power delivered to a load such as a light bulb or the like, the proximity detector of this invention is coupled to an integrating operational amplifier for providing output signal representative of the length of time that electromagnetic energy above a threshold is coupled to the receiving plate. After coupling ceases, the operational amplifier maintains the level of output signal. A control circuit is provided which is responsive to the output signal of the operational amplifier to adjust the power output of the system in a accordance therewith. More particularly, a control transistor or other device is provided which may be operated or biased so as to provide an output signal in response to a voltage relationship between the output signal of the operational amplifier and a time variant signal. The output signal of the control transistor determines the period of connection of a source of power to the load.

Yet another feature of this invention is the provision of a parameter selecting device having a proximity detector of this invention and a glow discharge tube for each parameter to be selected. One terminal of the glow discharge tube is suitably biased such that an output signal from the proximity detector causes conduction of the glow discharge tube. Capacitors are provided coupling the glow discharge tubes so as to provide a pulse to extinguish the glow discharge tube associated with the previously selected parameter upon selection of the next parameter.

BRIEF DESCRIPTION OF THE DRAWINGS

FIGS. 2 (a) and 2 (b) are circuit diagrams of two proximity detectors according to this invention, either of which may be used in the switching circuit of FIG. 1.

DETAILED DESCRIPTION OF THE PREFERRED EMBODIMENTS

Figures 1, 2A, 2B:
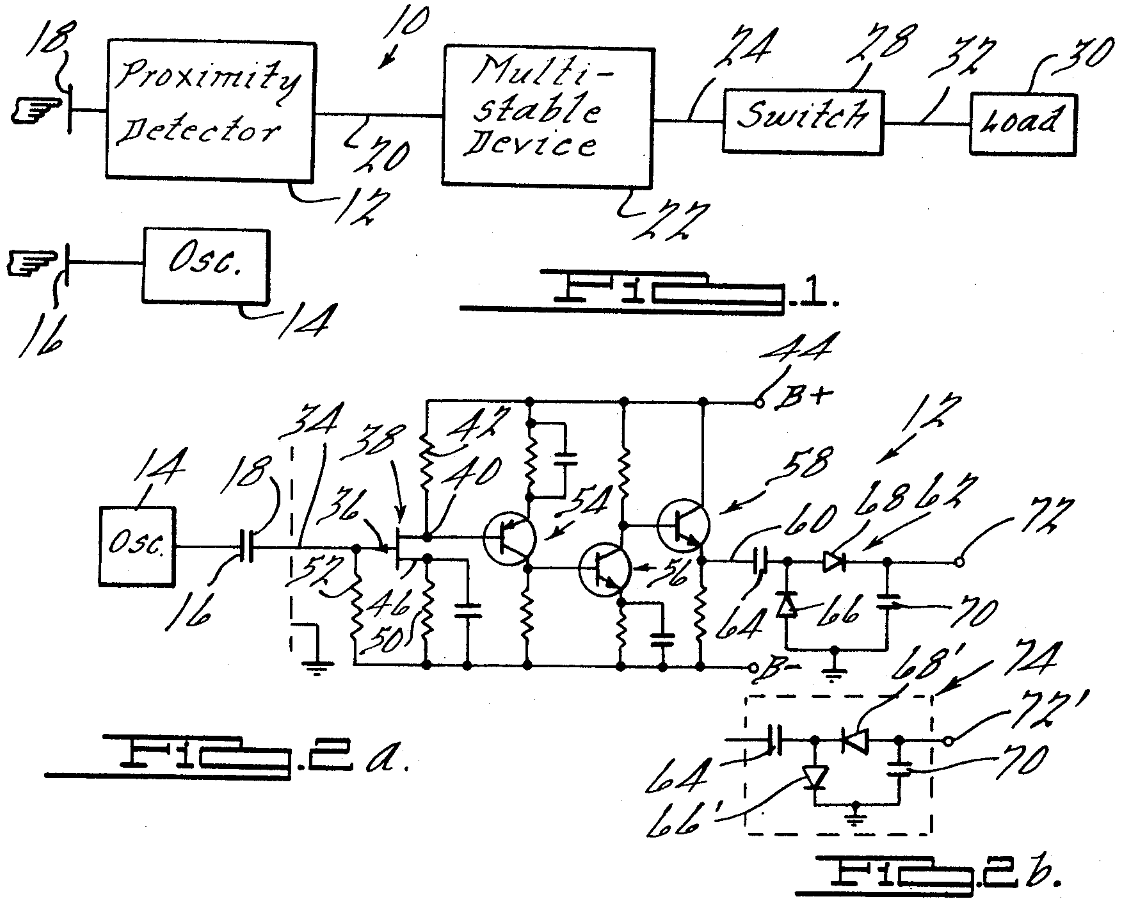
FIG. 1 is a block diagram of a switching circuit according to this invention.

In FIG. 1, a block diagram of a proximity switch 10 is shown having a proximity detector 12 according to this invention. The proximity switch 10 responds to electromagnetic radiation coupled through a human body, member, or other suitable element from a transmitting plate 16 which is operatively connected to a source of oscillatory signals 14 to a receiving plate 18 for the proximity detector 12. The proximity detector 12 provides an output signal on a line 20 in response to electromagnetic radiation above a predetermined threshold level coupled to the receiving plate 18. A multi-stable device 22, receiving output signals from the proximity detector 12 on the line 20, changes state upon each occurrence of an output signal on the line 20. For example, the multi-stable device 22 may have two stable states for successive switching between the two states upon each occurrence of a signal on the line 20. The multi-stable device 22 provides a signal on line 24 when it is in one state and no signal when it is in its other state. A switch 28, receiving the signals from line 24, is operative to supply power to a load 30 on a line 32 when the multi-stable device 22 is in the one state.

In the embodiment of FIG. 1, the transmitting plate 16 and the receiving plate 18 are spaced apart a sufficient distance such that an operator is required to use both hands to activate the switch. This construction may be used to advantage as a safety feature on machinery such as presses and the like. Additionally, this feature can prevent the accidental operation of an appliance such as a stove when it is cleaned by locating the plates such that they would not be contacted simultaneously in a cleaning operation.

In FIG. 2 (a), a circuit diagram is shown of the proximity detector 12. The proximity detector 12 operates in association with a source 14 of oscillatory signals which are radiated from a transmitting plate 16. The proximity detector 12 has a receiving plate 18 for receiving electromagnetic energy coupled from the transmitting plate 16 by any suitable element. The receiving plate 18 is connected by a conductor 34 to the gate terminal 36 of a field effect transistor 38. The supply terminal 40 of the field effect transistor 38 is connected through a supply resistor 42 to a source of potential 44 at a voltage B+, for example, +12 volts. A drain terminal 46 is connected to source 48 of potential B−, for example, −12 volts, through a biasing resistor 50. The gate 36 is biased above the source 48 by a suitable biasing resistor 52 such that the field effect transistor 38 operates as an amplifier.

The field effect transistor 38 is characterized by a high input impedance which substantially matches the high output impedance of the circuit comprising the receiving plate 18, the coupling element, the transmitting plate 16, and the oscillator 14.

The field effect transistor 38 is a threshold-type device. That is, variations in current from the supply terminal 40 to the drain terminal 46 are unconsequential until the current into the gate terminal 36 reaches a predetermined level. Therefore, until a predetermined intensity of electromagnetic radiation is received by the receiving plate 18 which is sufficient to induce a gate current at or above the threshold, the output from the field effect transistor 38 is negligible. Accordingly, a certain degree of proximity of the member coupling the electromagnetic energy from the transmitting plate 16 to the receiving plate 18 is required. This feature prevents inadvertent switching in response to lower order coupling between the transmitting plate 16 and receiving plate 18 by remotely located electromagnetic couplers.

Amplifier stages 54, 56 and 58 are provided to receive the output of the field effect transistor 38 and to provide a greatly amplified output signal on line 60 in response to coupling of electromagnetic radiation above the threshold level to the receiving plate 18. Each of the amplification stages 54, 56 and 58 includes a single transistor. The first two stages are connected in a common emitter configuration, whereas the final stage is connected in a common collector configuration. Suitable bias resistors are provided as shown.

The operating conditions for the amplifying stages 54, 56 and 58 are established so that each is driven to a saturation condition which results in clipping of the sine wave derived from the field effect transistor 38. Due to the clipping, a substantially square waveform is producted at the output 60 of the final amplification stage 58. For source potentials of ±12 volts, the output signal varies from substantially +12 volts to −12 volts.

A voltage doubler 62 is provided to rectify and substantially increase the voltage supplied by the final amplification stage 58, e. g. from ±12 volts to +12 volts. The voltage doubler 62 includes a coupling capacitor 64, a grounding diode 66, a transmission diode 68, and a filter capacitor 70. To understand the operation of the voltage doubler 62, consider a waveform on output line 60 which initially is of negative polarity. Since the diode 66 maintains the right terminal of the capacitor 64 at ground potential or above, the negative portion of the waveform will establish a potential across the diode being negative at the left terminal and substantially equal to B−. The next occurrence of the portion of the waveform having positive polarity will cause an intermediate rise in the potential across the capacitor 64 of an additional 12 volts since the capacitor, by its nature, requires some period of time for dissipation of its charge. This immediate voltage rise across the capacitor will be slightly less than 2B+, e. g. +20 volts. The voltage rise is transmitted through the diode 68 to the output terminal 72 of the proximity detector 12 under the influence of the filtering capacitor 70. More particularly, the filtering capacitor 70 functions to maintain the doubled voltage at the output terminal 72 for a small period of time.

In some cases, it is desirable to have a negative voltage output. A circuit for providing a negative voltage output at an output terminal 72' is shown in FIG. 2 (b). More particularly, the circuit of FIG. 2 (b) is a voltage doubler 74 to be used in place of the voltage doubler 62 of FIG. 2 (a).

The voltage doubler 74 of FIG. 2 (b) includes a coupling capacitor 64, a grounding diode 66', a transmission diode 68', and a filter capacitor 70. From FIG. 2 (b) it can be seen that each of the diodes having a polarity opposite that of the diodes of the doubling circuit 62 of FIG. 2 (a).

To facilitate an understanding of the voltage doubler of 74 of FIG. 2 (b), consider initially the portion of an input current waveform having a positive polarity. The capacitor 64 will have a potential substantially equal to −B volts imposed across it, the left side being of positive polarity. On the arrival of the portion of the current waveform having a negative polarity, the voltage impressed across the capacitor will suddenly rise to a negative potential which is nearly twice the supply voltage B−. This voltage is transmitted to the output terminal 72' through the transmitting diode 68 under the influence of the filtering capacitor 70.

In the operation of the proximity detector 12 of FIG. 2, electromagnetic radiation coupled to the receiving plate 18 provides an induced current in the conductor 34 which is proportional to the strength of the coupled electromagnetic energy, and which oscillates at the same frequency thereof. The induced currents are supplied to the gate terminal 36 by the field effect transistor 38 to provide amplified current signal which flows from the supply terminal 40 to the drain terminal 46. The amplified current signal is further amplified successively by the first amplifying stages 54, 56 and 58 to provide an output signal on line 60 which is at the frequency of the coupled electromagnetic radiation.

The alternating signal on line 60 from the final output amplifying stage 58 is doubled and rectified by the doubling circuit 62 to provide a fast rise time voltage output at the output terminal 72 of the proximity detector 12 which is sustained for so long as coupling between the transmitting plate 16 and the receiving plate 18 continues. Although the preferred embodiment of the present invention responds to capacitive coupling of electromagnetic energy, an embodiment responding to inductive coupling may be constructed readily by replacing the capacitive coupling plates 16 and 18 with suitable inductive coupling elements.

It will now be appreciated that the proximity detector 12 provides a signal only during periods of continuous coupling. In the operation of the switch and many other controls, it is often desirable that a momentary occurrence of coupling establishes a condition which remains constant until a second momentary coupling occurrence. To accomplish this function, a multi-stable device 22, in this case a device having two stable states, is provided as shown in detail in FIG. 3.

The multi-stable device 22 has a first transistor 78 and a second transistor 80. The emitters 82 and 84 of transistors 78 and 80, respectively, are connected to a source 83 of negative potential B− through a resistor 86. The collector 88 of the transistor 78 is connected to a source 90 of positive potential B+ through a resistor 92; and the collector 94 of the transistor 80 is collected to the source 90 through a resistor 96. The bases of the transistors 78 and 80 are each connected to the collector of the other through parallel circuit combinations 98 and 100, respectively, each circuit combination comprising a resistor and a capacitor. The bases of transistor 78 and 80 are connected also to a coupling capacitor 102 by resistors 104 and 106, respectively. An input terminal 108 for the multi-stable device 22 is provided which is biased by a resistor 110 connected to source 84. In operation, the input terminal 108 is connected to the output terminal 72 of the proximity detector 12 by a line 20 (FIG. 1).

In considering the operation of the multi-stable device 22, initially assume that the transistor 78 is nonconducting and the transistor 80 is conducting. Under those operating conditions, a positive voltage B+ will appear at the collector 88 of the transistor 78. This voltage is fed to the base of transistor 80 through the circuit combination 100 to maintain the forward bias of the transistor 80. The transistor 78 remains reversed biased by the potential impressed upon it through the circuit combination 98 connected to the emitter 94 of transistor 80 which is at a much lower potential than B+ since the transistor 80 is conducting.

When a positive, fast rise signal from the output terminal 72 of the proximity detector 20 is applied to the input terminal 108, a positive potential spike, provided by the coupling capacitor 102, is delivered to the base of the transistors 78 and 80. The positive spike causes the base of the transistor 80 to become more positive so as to sustain the forward bias of the transistor 80, and therefore, has no effect. On the other hand, the positive spike will cause the base of the transistor 78 to become positive with respect to the emitter 82 thereby turning on the transistor 78 and causing the potential at the collector 88 to drop sharply. The lowered potential at the collector 88 of the transistor 78 is delivered to the base of the transistor 80 through circuit 100 to reverse bias transistor 80. Accordingly, the transistor 80 is turned off. When the transistor 80 is turned off, the potential at collector 94 rises to near B+. This potential is applied to the base of the transistor 78 by the circuit 98 to maintain the forward bias of the transistor 78. The next fast rise positive potential from the proximity detector 12 repeats of the above process to revert to the first stable state.

The output signal from the multi-stable circuit 22 is taken from the collector 94 of the transistor 80 by an appropriate connection to an output terminal 112. The potential at the output terminal 112 switches from approximately +12 volts to approximately 0 volts in accordance with the stable state of the multi-stable circuit 22.

It will now be appreciated that each fast rise signal from the proximity detector 12, representative of electromagnetic coupling between the transmitting plate 16 and the receiving plate 18, changes the state of the multi-stable device 22. It will further be appreciated that a multi-stable device 22 may be incorporated having more than two stable states such as a shift register.

Figures 3, 4:
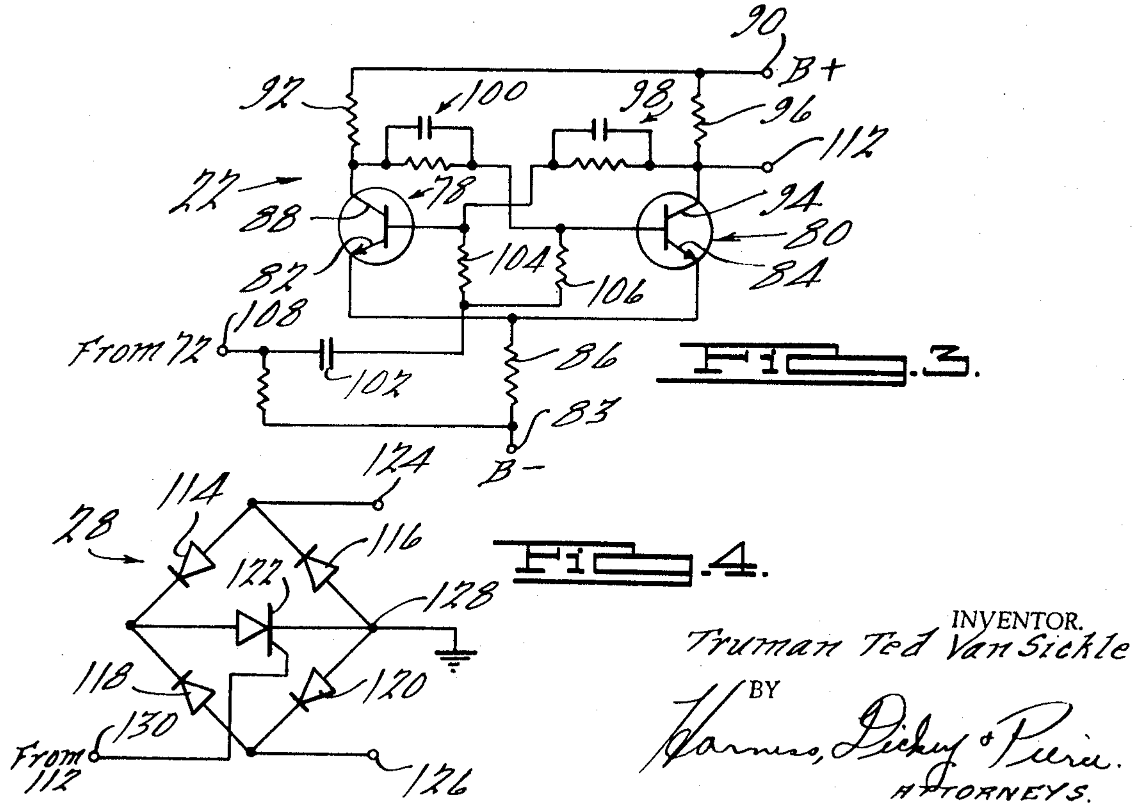
FIG. 3 is a circuit diagram of a multi-stable device having two stable states which may be used in the switching circuit of FIG. 1.
FIG. 4 is a circuit diagram of an electronic switch which may be used in the switching circuit of FIG. 1.

In FIG. 4, a circuit diagram is shown for an electronic switch 28 which is operated by the multi-stable device 22. The switch 28 comprises a bridge having four arms consisting of diodes 114, 116, 118, and 120; and a SCR 122 connected across one pair of opposite terminals of the bridge. The other pair of opposite terminals are adapted to receive an alternating supply current from the terminals 124 and 126. It will be appreciated that there is a path for a positive polarity component of an alternating current from the terminal 124 to the terminal 126 through the diode 114, the SCR 122, and the diode 120. Moreover, there is a path for a negative polarity component of an alternating current from the terminal 124 to the terminal 126 through the diode 116, the SCR 122, and the diode 118. It can be seen that the SCR 122 controls both of these paths such that the switch is open if the SCR 122 is turned off, and the switch is closed if the SCR 122 is turned on. A connection to ground for terminal 128 is provided which is reference with respect to the supply B+ of the proximity detector 12 and the multi-stable device 22. This ground, however, is isolated from the source of alternating currents impressed across terminals 124 and 126.

The potential from the terminal 112 of the multistable circuit 22 is delivered to an input terminal 130 by a conductor 24 (FIG. 1) so as to turn on the SCR 122 when the potential on terminal 112 is near B+, and to turn off the SCR 122 when the potential on terminal 112 is near zero.

From the above it can be seen that the bistable device, which is operated by the proximity detector 12, operates the electronic switch 28 such that a load connected in series with the switch 28 may be controlled thereby.

Figure 5:
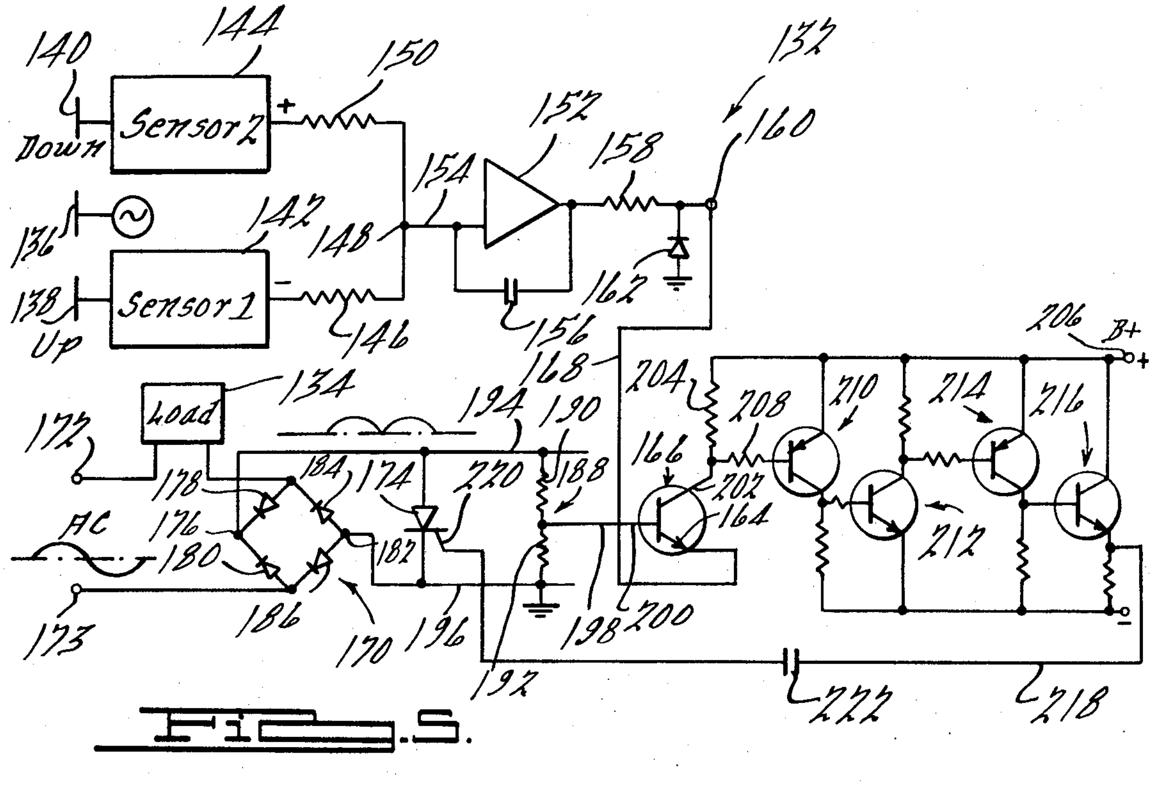
FIG. 5 is a circuit diagram of a control for adjusting the power level to a load using the two proximity detectors shown in FIG. 2.

In FIG. 5, a circuit diagram for a dimmer control 132 is illustrated. The dimmer control 132 is operable to increase the power delivered to a load 134 in accordance with the length of time that electromagnetic energy above a predetermined threshold level is coupled between a transmitting plate 136 and an UP receiving plate 138, and to decrease the power delivered to the load 134 in accordance with the length of time that electromagnetic energy above a predetermined threshold level is coupled between the transmitting plate 136 and a DOWN receiving plate 140.

The dimmer control 132 is provided with a first sensor 142 and a second sensor 144, each according to this invention. The first sensor 142 is adapted as shown in FIG. 2 (b) to provide a negative potential in response to coupling above a threshold level between the transmitting plate 136 and the UP receiving plate 138 which is coupled through a resistor 146 to a summing terminal 148. The second sensor 144 is adapted as shown in FIG. 2 (a) to provide a positive signal in response to coupling between the transmitting plate 136 and the DOWN receiving plate 140 which is coupled through a resistor 150 to the summing terminal 148. The summing terminal 148 is connected to an integrating operational amplifier 152 by a conductor 154. As an example, a RCA operational amplifier, Catalog Number: RCA CA 3032-702C, may be used as the operational amplifier 152. A feedback capacitor 156 coupled the output of the operational amplifier 152 to its input. The output of the operational amplifier 152 is coupled through a resistor 158 to an output terminal 160 which is always maintained at ground potential or above by a diode 162 connected to ground. The output terminal 160 is connected to the emitter terminal 164 of a control transistor 166 by a conductor 168 such that the signal on output terminal 160 establishes the emitter bias of the transistor 166.

The load 134 and a four diode rectifying bridge 170 are connected in series across power terminals 172 and 173 which are adapted to be connected to a source of alternating current, for example, 110 volts AC at 60 cycles. The bridge 170 functions as an electronic switch in combination with an SCR 174 as described in connection with FIG. 4. In view of the detailed explanation of the electronic switch of FIG. 4, a detailed explanation of the bridge 170 in its function as part of an electronic switch will not be described in detail here.

The bridge 170 also serves as a full wave voltage rectifier. More particularly, the bridge has a path for positive polarity current through diodes 178 and 180. A path for negative polarity current is provided by diodes 184 and 186. Accordingly, the bridge 170 provides a full wave rectified power supply at terminals 176 and 182 which is delivered in the form of a time-variant waveform substantially as shown in FIG. 5.

In view of the above discussion, it will be appreciated that the bridge 170 acts as a switch in combination with the SCR 174, and additionally, provides a full wave rectified supply voltage across terminals 176 and 182.

The time-variant full wave rectified voltage across terminals 176 and 182 is supplied to a voltage divider 188 having resistors 190 and 192 by conductors 194 and 196, respectively. The voltage divider 188 provides time-variant output signal on line 198 of approximately 11 volts peak which is supplied to the base terminal 200 of the control transistor 166. The emitter 202 of the control transistor 166 is connected through a resistor 204 to a source 206 of potential at a voltage B+.

Thus, the conducting state of the control transistor 166 is determined by the relationship between the time-variant voltage from the voltage divider 188 and the voltage level of the signal on the output terminal 160 from the operational amplifier 152. An output signal from the control transistor 166 is taken from the emitter terminal 202 through a resistor 208 which is connected in succession to a common collector amplifying stage 210, a common emitter amplifying stage 212, a common collector amplifying stage 214, and a common emitter amplifying stage 216 to provide a greatly amplified signal at the output of the final stage 216 on line 218. The amplified signal on line 218 is connected to the control terminal 220 of the SCR 174 through a coupling capacitor 222.

In the operation of the dimmer control 132, consider a condition under which no power is being delivered to the load 134 and it is desired to increase the power level to the load 134. The operator places his hand or other member in the vicinity of the transmitting plate 136 and the UP receiving plate 138 so as to couple electromagnetic energy above a predetermined threshold therebetween. In response to the coupling, the first sensor 142 provides a negative voltage to the summing terminal 148 which will be integrated and amplified by the operational amplifier 152. As will be appreciated in view of the discussion hereinafter, the signal at the output terminal 160 is at peak voltage, i. e. 12 volts, when there is no power delivered to the load 134. The integrated and amplified signal from the operational amplifier 152 decreases the potential at the output terminal 160 in accordance with the length of time of coupling occurs above the threshold. Upon the operator's removal of the coupling member, the potential fall at terminal 160 will cease. However, by virtue of the characteristics of the operational amplifier 152 herein described, the potential level at the output terminal 160 will remain constant. As an example, the potential may have decreased from its initial state of 12 volts to 6 volts. The 6 volt potential establishes the bias of the emitter 164 of the control transistor 166.

As explained previously, the base of the control transistor 166 receives a full wave rectified voltage which peaks at approximately 11 volts. It will be appreciated that the control transistor 166 is forward biased during the portion of the full wave cycle wherein the voltage applied to the base 200 of the transistor 166 is above 6 volts. Therefore, during that portion the control transistor 166 will conduct to yield an output at its collector 202 which is amplified by the amplifying stages 210, 212, 214, and 216, respectively. The amplified signal is applied to the control terminal 220 of the SCR 174 to cause the SCR to conduct thereby closing the circuit through the load 134. It will be appreciated that conduction only occurs for a portion of a full wave cycle, and consequently, the power delivered to the load 134 varies in accordance with that portion.

The portion during which power is delivered to the load 134 may be temporarily varied by changing the bias of the emitter terminal 164 of the transistor 166 with respect to the peak of the full rectified wave received by the base terminal 200. As an example, a zero potential at the output terminal 160 applied to the emitter 164 of the transistor 166 will forward bias the transistor 166 at all times thereby continually maintaining the electronic switch in conduction so as to apply full AC power to the load 134. On the other hand, a potential of 12 volts on the output terminal 160 will reverse bias the transistor 166 at all times thereby continually maintaining the electronic switch in the open state so as to deliver no power to the load. Intermediate potentials at the output terminal 160 will provide intermediate power levels by causing the electronic switch to conduct intermittently in inverse relationship to the potential on terminal 160.

Consider now a condition wherein the load 134 is receiving a preset level of power and it is desired to decrease the power delivered to the load 134. An element or member is positioned by the operator so as to couple electromagnetic energy above a predetermined threshold level between the transmitting plate 136 and the DOWN receiving plate 140. In response to the coupled electromagnetic energy, the second sensor 144 provides a positive potential at the summing terminal 148 which is applied to the operational amplifier 152 to increase the voltage at the output terminal 160 in accordance with the length of time of coupling above the threshold. From the previous discussion, it will be appreciated that the increased voltage at the output terminal 160 decreases the cyclic period of conduction of the electronic switch comprising bridge 170 and SCR 174 to correspondingly decrease the power delivered to the load 134.

Figure 6:
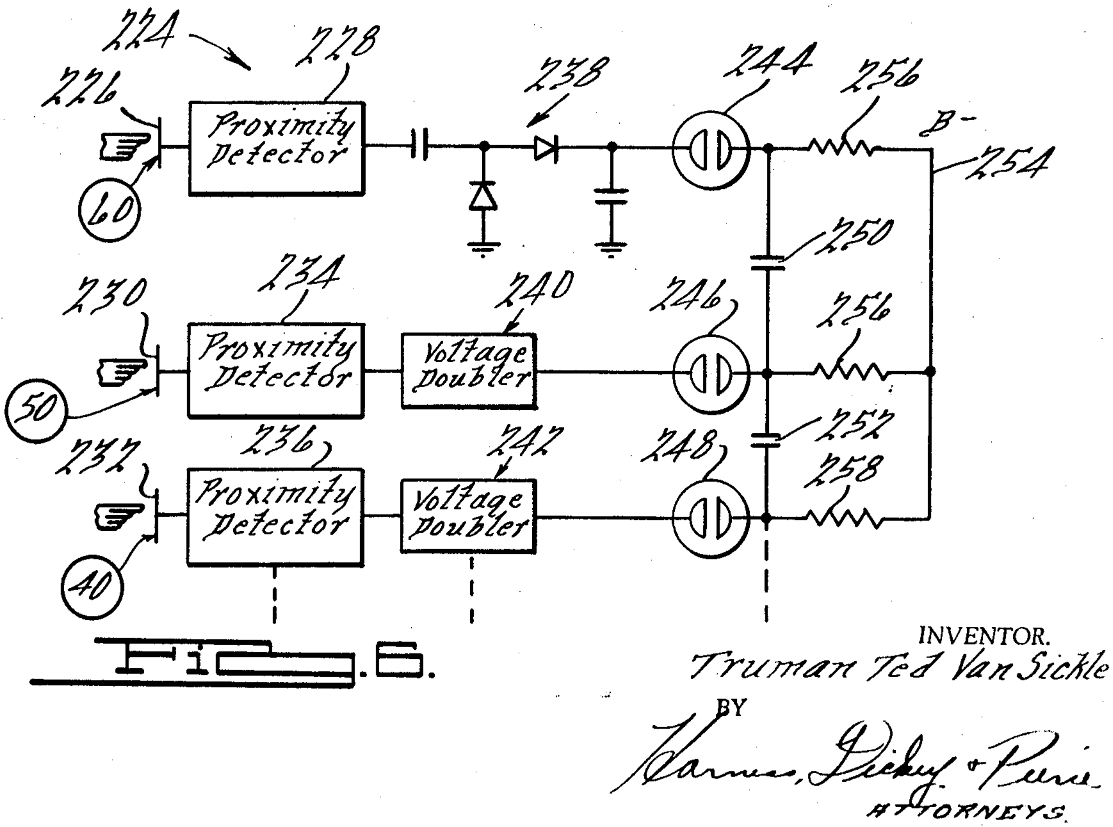
FIG. 6 is a schematic diagram of a parameter selection circuit according to this invention using three proximity detectors as shown in FIG. 2.

In FIG. 6, a circuit 224 is shown for the mutually exclusive selection of a plurality of parameters. The selection circuit 224 may be used in a patient monitoring system which, for example, sounds an alarm if the heartbeat of the patient drops below a preselected level. For purposes of illustration, three preselected levels, 40, 50 and 60 heartbeats per minute, are shown. Each parameter has an associated proximity detector and receiving plate encoded with the particular parameter.

With reference to the preferred embodiment shown, parameter 60 is provided with a receiving plate 226 and a proximity detector 228. In similar fashion, the parameters 50 and 40 are provided with receiving plates 230 and 232, and proximity detectors 234 and 236, respectively. The proximity detectors 228, 234, and 236 have associated voltage doubler circuits 238, 240 and 242, respectively, which are described in detail with respect to FIG. 2 (a).

Glow discharge tubes 224, 246 and 248 which may be neon filled tubes are connected to the outputs of voltage doublers 238, 240, and 242, to provide a means for indicating the selected parameter. The outputs of the glow discharge tube are interconnected by capacitors 250 and 252. The outputs of each glow discharge tube are connected also to a source 254 of potential B−, e. g., −110 volts, through a resistor 256.

To achieve an understanding of operation of the selection circuit 224, consider the case wherein it is desired to select the parameter 60. The operator may position his hand or other coupling element so as to couple electromagnetic energy above a threshold to the receiving plate 226 from a source of electromagnetic radiation (not shown). As explained with regard to FIG. 2 (a), the proximity detector 228 will yield a positive output voltage which is nearly doubled by the voltage doubler 238. Accordingly, a positive potential will be impressed upon the left terminal of the glow discharge tube 244 e. g., approximately +20 volts. The positive potential on the left terminal, in combination with the negative potential on the right terminal of the glow discharge tube 244 provided by the source B−, is sufficient to cause breakdown of the glow discharge gas and subsequent conduction through the tube to ground (via the diodes of the voltage doubler 238). After conduction is initiated, the potential from the source 254 at potential B− is adequate to maintain the tube 244 in a conducting state.

Consider now the case wherein the operator desires to change the selected parameter to 50 heartbeats per minute. The operator couples electromagnetic energy to the receiving plate 230 so as to provide a positive potential output from the associated voltage doubler 240. The positive output is applied to the left terminal of the glow discharge tube 246 to cause that tube to conduct to ground. Conduction through the glow discharge tube 246 results in a voltage rise at the right terminal of the glow discharge tube 246 which is differentiated by the capacitor 250 so as to apply a positive voltage spike to the right terminal of the conducting glow discharge tube 244 which is adequate to turn off the glow discharge tube 244. Therefore, it will be appreciated that selection of the parameter 50 has caused the associated glow discharge tube 246 to conduct, and the previously selected glow discharge tube 244 to stop conducting.

This process is repeated regardless of the sequence of activation of the parameter circuits. Additionally, the activation of a parameter circuit which is spaced apart from the previously selected parameter circuit functions to turn off the previously selected glow discharge tube even though a series combination of capacitive links is involved.

The conduction of the glow discharge tubes 244, 246 or 248 can be sensed by an appropriate logic circuit which responds to the voltage drop across the capacitor of the associated voltage doubler to provide an indication of the selected parameter.

If desired, more or less than three parameters may be accommodated by increasing or decreasing the number of parameter circuits. MOreover, the glow discharge tubes 244, 246 and 248 may be replaced by a voltage responsive shift register, any other suitable indicating output circuit, or a suitable utilization circuit.

In view of the above description of the proximity detector and associated circuitry of this invention, it will be appreciated that a highly durable apparatus is provided which may be readily sealed against corrosion, moisture and contamination. Moreover the apparatus of this invention has improved esthetic appearance over prior art devices accomplishing similar functions. Additionally, the apparatus of this invention has a wide range of uses, for example, it can be used as a volume control in a radio or phonograph, an automatic tuning device or a temperature control for a stove or the like. It further will be appreciated that the proximity detector of this invention can be operated by elements other than a human member such as by the level of liquid in a container, and may be operated either by direct contact of a coupling element or by a closely adjacent relationship of the coupling element.

While it will be apparent that the embodiments of the invention disclosed are well calculated to teach the preferred manner of practicing this invention, it will be appreciated that the invention is susceptible to modification, variation and change without departing from the proper scope or fair meaning of the subjoined claims.

What is claimed is:

1. An apparatus for selecting one of a plurality of parameters comprising means for each of said parameters for receiving electromagnetic energy coupled thereto by proximity of a coupling element, said means characterized by a high output impedance;

means associated with each of said receiving means characterized by a high input impedance operatively connected to said associated receiving means for providing a signal representative of coupled electromagnetic energy above a predetermined level;

means receiving said last means signal for providing an indication of a parameter selected by coupling of said predetermined level of electromagnetic energy to the receiving means for said selected parameter, said indicating means further including means for cancelling indications of previous preselected parameter upon selection of said selected parameter, said indicating means also including a glow discharge tube which conducts in response to said signal representative of coupled electromagnetic energy above said predetermined level, and capacitors linking one terminal of each of said glow discharge tubes for providing a potential pulse in response to the selection of one tube to each other tube, said pulse being operative to turn off a glow discharge tube representative of a parameter.

2. The apparatus of claim 1 wherein said means for providing a signal representative of coupled electromagnetic energy is a field effect transistor having a gate terminal operatively connected to said receiving means, a supply terminal, and a drain terminal, said signal representative of coupled electromagnetic energy above and said predetermined level being flow of current between said supply terminal and said drain terminal.

* * * * *